United States Patent
Zhu et al.

(10) Patent No.: US 9,306,334 B2
(45) Date of Patent: Apr. 5, 2016

(54) HIGH SPEED PLUG CONNECTOR HAVING IMPROVED HIGH FREQUENCY PERFORMANCE

(71) Applicant: HON HAI PRECISION INDUSTRY CO., LTD., New Taipei (TW)

(72) Inventors: Jian-Jun Zhu, Kunshan (CN); Jerry Wu, Irvine, CA (US)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/287,573

(22) Filed: May 27, 2014

(65) Prior Publication Data

US 2014/0349496 A1      Nov. 27, 2014

(30) Foreign Application Priority Data

May 24, 2013    (CN) .......................... 2013 1 0197331

(51) Int. Cl.
| | |
|---|---|
| H01R 3/00 | (2006.01) |
| H01R 13/6471 | (2011.01) |
| H05K 1/02 | (2006.01) |
| H01R 9/03 | (2006.01) |
| H01R 13/6585 | (2011.01) |
| H05K 1/11 | (2006.01) |

(52) U.S. Cl.
CPC .......... *H01R 13/6471* (2013.01); *H05K 1/0219* (2013.01); *H01R 9/034* (2013.01); *H01R 13/6585* (2013.01); *H05K 1/0245* (2013.01); *H05K 1/117* (2013.01); *H05K 2201/09336* (2013.01); *H05K 2201/09409* (2013.01); *H05K 2201/10356* (2013.01)

(58) Field of Classification Search
CPC . H01R 2103/00; H01R 23/662; H01R 23/688

USPC .................................. 439/108, 581, 633, 497
See application file for complete search history.

(56) References Cited

U.S. PATENT DOCUMENTS

| | | | |
|---|---|---|---|
| 7,453,338 B2 | 11/2008 | Aronson | |
| 8,011,950 B2* | 9/2011 | McGrath et al. ...... | H01R 12/594 439/497 |
| 8,267,718 B2* | 9/2012 | Straka ................ | H01R 13/6471 439/497 |
| 8,303,314 B2 | 11/2012 | Wu | |
| 8,692,128 B2 | 4/2014 | Su et al. | |
| 2006/0228935 A1* | 10/2006 | Wen ...................... | H01R 12/62 439/497 |
| 2007/0278001 A1* | 12/2007 | Mayder ................ | H05K 1/0219 174/262 |
| 2009/0221165 A1 | 9/2009 | Buck et al. | |

(Continued)

*Primary Examiner* — Abdullah Riyami
*Assistant Examiner* — Thang Nguyen
(74) *Attorney, Agent, or Firm* — Ming Chieh Chang; Wei Te Chung

(57) ABSTRACT

A plug connector (100) includes a shell (10) and a printed circuit board (20) received in the shell. The printed circuit board includes a grounding layer (22), a conductive layer (21) disposed at a first side of the grounding layer, and an insulative layer (23) disposed therebetween. The conductive layer includes a pair of grounding traces (210), and a signal channel disposed between and isolated with the grounding traces. The signal channel includes a signal mating portion (221) disposed at a front portion. Each of the grounding traces includes a grounding mating portion (211) disposed at a front portion. Each of the grounding mating portions has a front end extending beyond the signal mating portion. The printed circuit board includes a pair of connecting traces (214). Each of the front ends of the grounding mating portions directly connects with the grounding layer by corresponding one of the connecting traces.

2 Claims, 7 Drawing Sheets

(56) References Cited

U.S. PATENT DOCUMENTS

2010/0029104 A1* 2/2010 Patel .................. H01R 13/6658
439/76.1
2012/0003848 A1 1/2012 Casher et al.
2014/0041937 A1* 2/2014 Lloyd et al. .................. 174/74 R

* cited by examiner

HIGH SPEED PLUG CONNECTOR HAVING IMPROVED HIGH FREQUENCY PERFORMANCE

BACKGROUND OF THE INVENTION

1. Field of the Invention

The present invention relates to a plug connector, and more particularly to a plug connector for high frequency application.

2. Description of Related Arts

U.S. Pat. No. 8,267,718, issued on Sep. 18, 2012 to Straka et al., discloses a plug connector assembly. The plug connector assembly comprises a shell, a printed circuit board received in the shell, and a cable connected with the printed circuit board. The printed circuit board comprises, e.g., for an outer layer thereof, a plurality of grounding traces, a plurality of signal trace pairs, and grounding traces. The signal trace pair are disposed between and isolated from two adjacent grounding traces. Vias (plated through holes) interconnect conductive ground plane/traces of various layers.

U.S. Publication No. 2009/0221165, published on Sep. 3, 2009, to Buck et al., discloses a connector assembly comprising a receptacle connector and a mating plug connector. The receptacle connector comprises a pair of grounding contacts, a pair of differential signal contacts, and a bridge member connecting with the pair of grounding contacts to improve signal transmission.

U.S. Pat. No. 7,453,338, issued on Nov. 18, 2008 to Aronson, discloses an electrical connection system for use in connection with high frequency communication signals. The system or high speed plug connector comprises a printed circuit board comprising a plurality of ground contact pads, a plurality of signal contact pads, an internal ground plane, and a dielectric layer therebetween. The ground contacts pads are typically longer than the signal contact pads. The ground contact pads are connected with the internal ground plane by vias at a rear of the ground pads.

An improved plug connector is desired to offer advantages over the related art.

SUMMARY OF THE INVENTION

An object of the present invention is to provide a plug connector having an improved signal transmitting speed.

To achieve the above-mentioned object, a plug connector adapted for mating with a mating connector and connecting with a cable, comprises a shell and a printed circuit board received in the shell. The printed circuit board comprises a grounding layer, a conductive layer disposed at a first side of the grounding layer and for electrically connecting with the mating connector, and an insulative layer disposed between the conductive layer and the grounding layer. The conductive layer comprises a pair of grounding traces, and a signal channel disposed between and isolated with the grounding traces. The signal channel comprises a signal mating portion disposed at a front portion for mating with the mating connector. Each of the grounding traces comprises a grounding mating portion disposed at a front portion for mating with the mating connector. Each of the grounding mating portions has a front end extending beyond the signal mating portion. The printed circuit board comprises a pair of connecting traces. Each of the front ends of the grounding mating portions directly connects with the grounding layer by corresponding one of the connecting traces.

According to the present invention, the plug connector comprises connecting traces directly connecting with the front end of the grounding mating portions to the grounding layer. Therefore, the speed of the plug connector could be improved.

DETAILED DESCRIPTION OF THE PREFERRED EMBODIMENT

Figure 1:
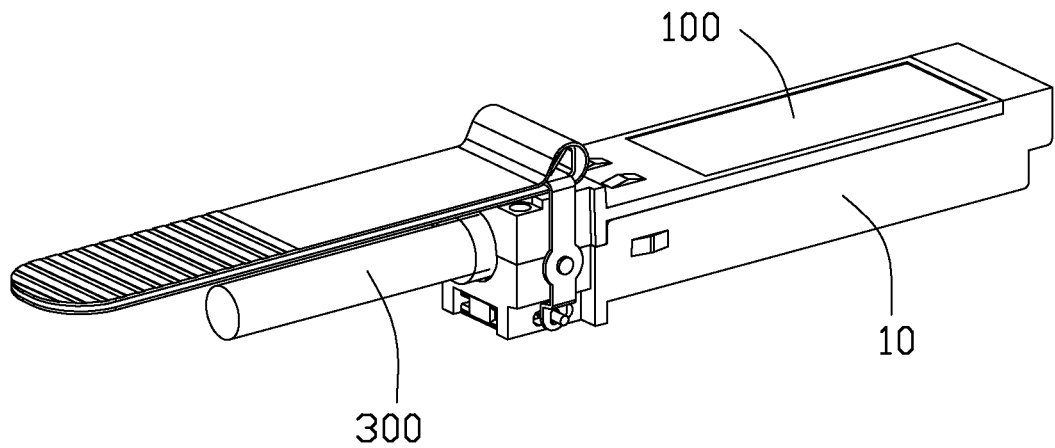
FIG. 1 is a perspective view of a plug connector connected with a cable in accordance with the present invention.
Figure 2:
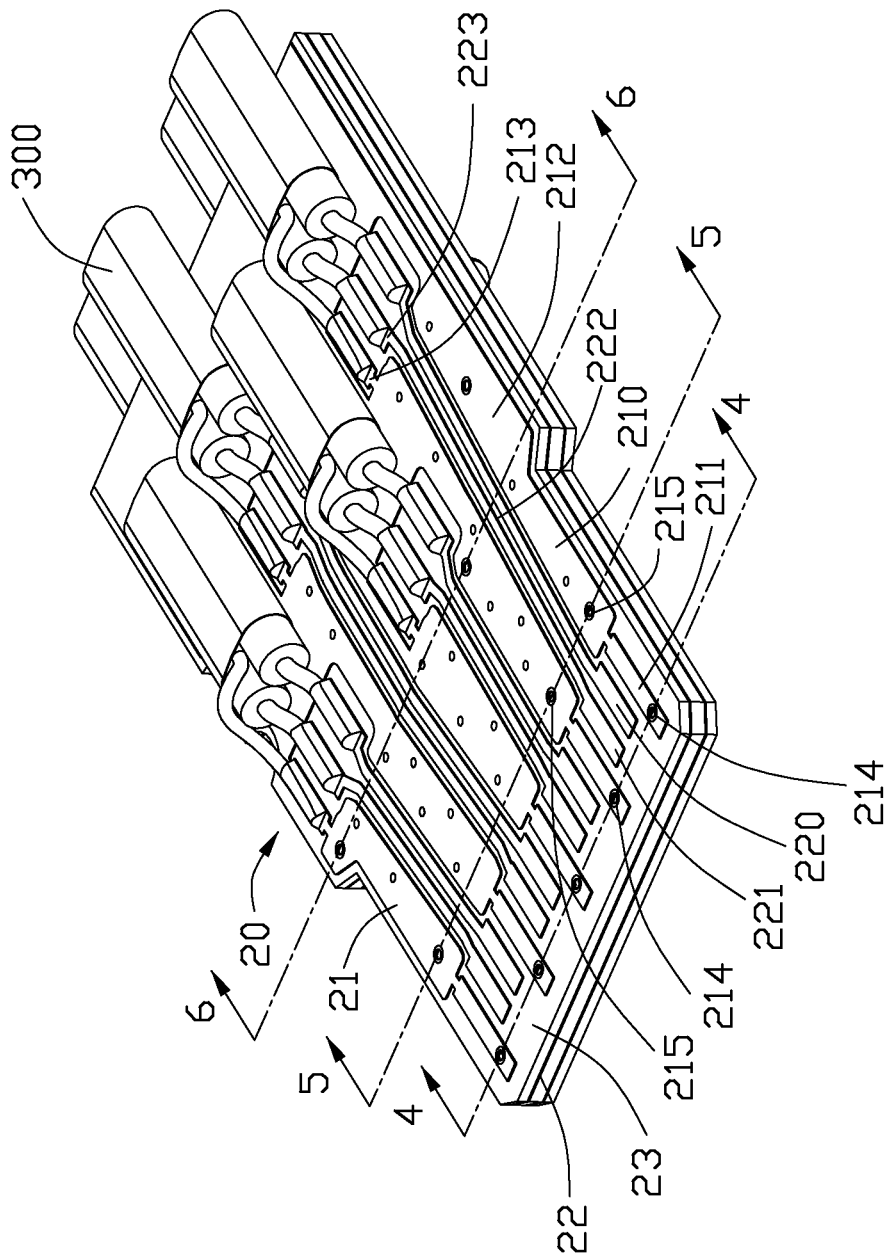
FIG. 2 is a perspective view of a printed circuit board connected with the cable of the plug connector as shown in FIG. 1.
Figure 3:
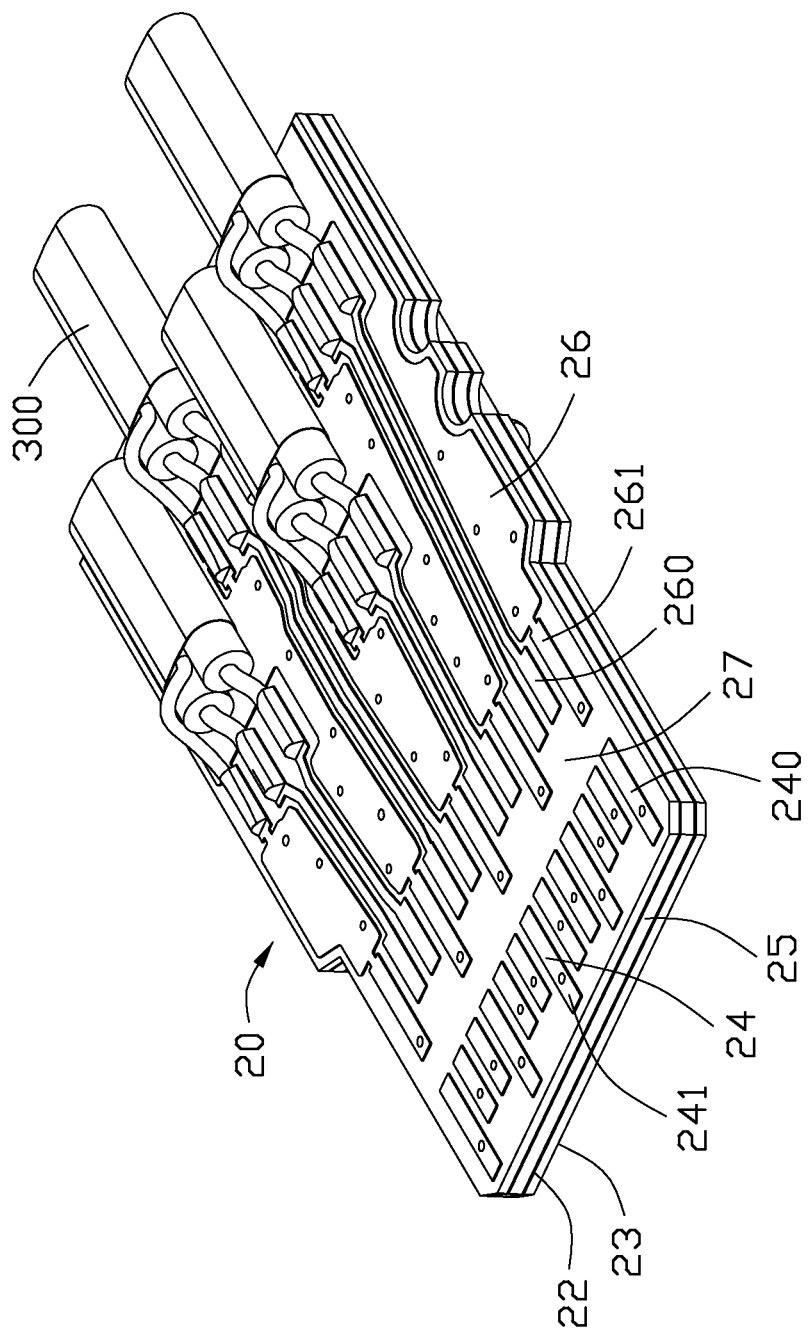
FIG. 3 is another perspective view of the printed circuit board as shown in FIG. 2.
Figure 4:
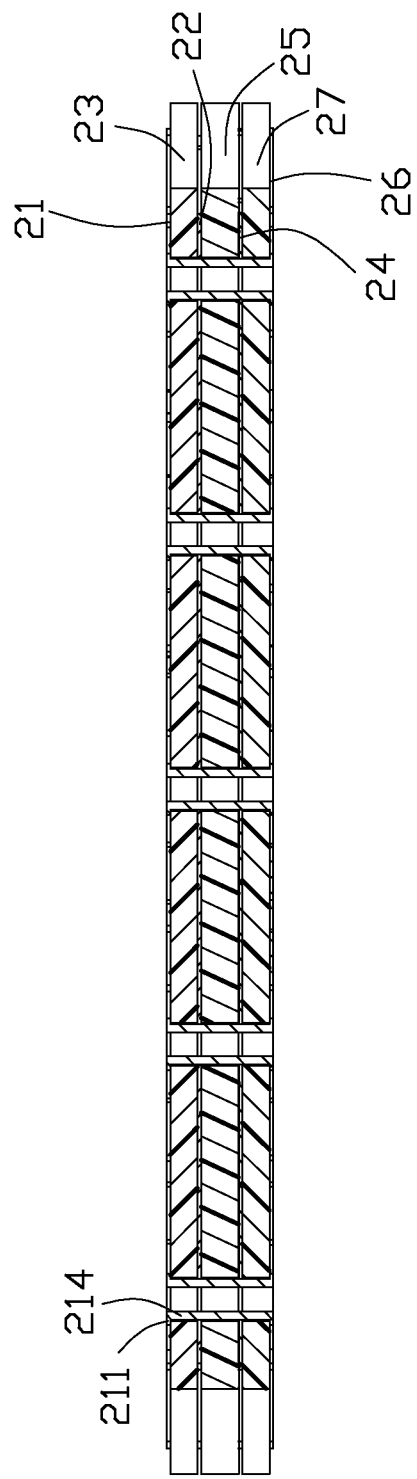
FIG. 4 is a cross-sectional view of the printed circuit board (the cable is removed) taken along line 4-4 of FIG. 2.
Figure 5:
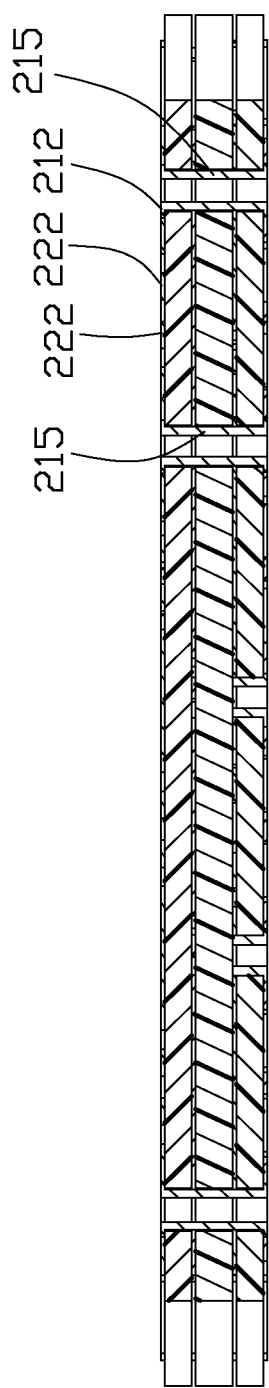
FIG. 5 is a cross-sectional view of the printed circuit board (the cable is removed) taken along line 5-5 of FIG. 2.
Figure 6:
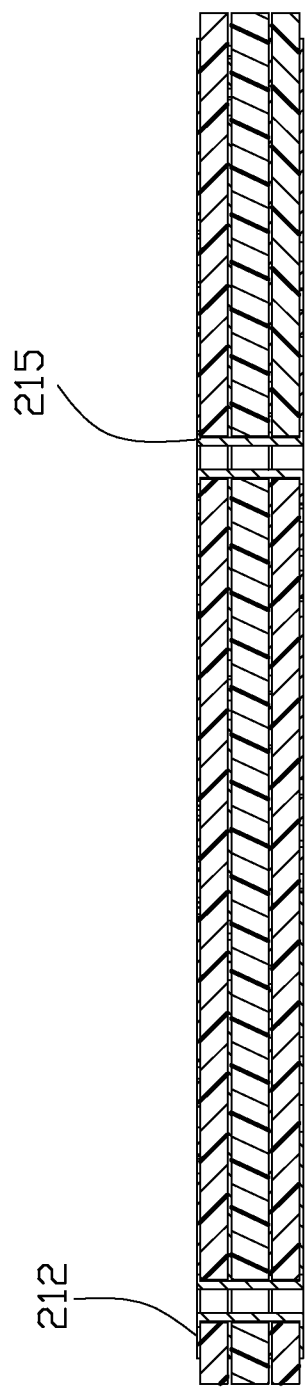
FIG. 6 is a cross-sectional view of the printed circuit board (the cable is removed) taken along line 6-6 of FIG. 2.

Reference will now be made in detail to a preferred embodiment of the present invention.

Referring to FIGS. 1 to 7, a plug connector 100 for mating with a mating connector and for connecting with a cable 300 comprises a shell 10 and a printed circuit board 20 received in the shell. The plug connector 100 connects with a copper cable 300 or coupled with an optical cable. The plug connector 100 also could be designed as an optical transceiver having an end for mating with the mating connector and an opposite side for coupling with an optical connector. The plug connector 100 comprises four receive channels and four transmit channels. The plug connector 100 also could be designed as a standard interface such as SFP, QSFP, PCIe, Mini SAS, etc. for high speed communication.

Referring to FIGS. 2 to 5, the printed circuit board 20 comprises a grounding layer 22, a conductive layer 21 disposed at a first side of the grounding layer 22 for electrically connecting with the mating connector, an insulative layer 23 disposed between the conductive layer 21 and the grounding layer 22, a first conductive layer 24 disposed at a second side opposite to the first side of the grounding layer 22, a first insulative layer 25 disposed between the grounding layer 22 and the first conductive layer 24, a second conductive layer 26 disposed at the second side of the grounding layer 22, and a second insulative layer 27 disposed between the first conductive layer 24 and the second conductive layer 26.

The conductive layer 21 comprises a plurality of first grounding traces 210 spaced apart from each other, and a plurality of first signal channel isolated from the first grounding traces 210 for transmitting high speed signal. Each of the first signal channels is disposed between a pair of adjacent first grounding traces 210. Each of the first signal channels could comprise a first signal trace 220 or a pair of signal traces 220 for transmitting differential signal. The adjacent first signal channels share a first grounding trace 210 which is disposed therebetween. The conductive layer 21 could comprise some conductive traces for transmitting control signal, lower speed signal or power signal etc as. Each of the first grounding traces 210 comprises a grounding mating portion 211 disposed at a front portion for mating with the mating connector, a first grounding body portion 212 disposed behind and connecting with the first grounding mating portion 211, and a first grounding connecting portion 213 disposed behind and connecting with the first grounding body portion 212 for connecting with the cable 300. Each of the first signal traces 220 comprises a signal mating portion 221 disposed at a front portion for mating with the mating connector, a first signal body portion 222 disposed behind and connecting with the first signal mating portion 221, and a first signal connecting portion 223 disposed behind and connecting with the first signal body portion 222 for connecting with the cable 300. Each of the first grounding mating portions 211 has a front end extending beyond the first signal mating portion 221. Therefore, when the plug connector 100 mating with the mating connector, the first grounding mating portion 211 electrically connecting with the mating connector prior to the first signal mating portion 221. Each of the first grounding mating portions 211 and the first signal mating portion 221 has a rear end, all of the rear ends aligned in a line. Each of the first grounding body portions 212 has a width larger than a width of the first grounding mating portion 211 and a width of the first grounding connecting portion 213. The first signal body portion 222 has a width smaller than a width of the first signal mating portion 221 and a width of a first signal connecting portion 223. Each of the front ends of the first grounding mating portions 211 directly connects with the grounding layer 22 by at least one via (plated through hole) or first connecting trace 214. Each of the first grounding body portions 212 directly connects with the grounding layer 22 by at least one second connecting trace 215. Therefore, the first grounding traces 210 are connected with the grounding layer 22 at a front and a rear of the first signal mating portion 221 that will improve the high speed transmitting performance of the first signal trace 220.

The first conductive layer 24 is disposed at an inner side of the second conductive layer 26. The printed circuit board 20 comprises a plurality of first conductive traces 240 for transmitting grounding signal, power signal, high speed signal or low speed signal etc. The first conductive traces 240 are disposed substantially coplanar with the second conductive layer 26 and electrically connected with the first conductive layer 24 by vias. Each of the first conductive traces 240 comprises a first mating portion 241 for mating with the mating connector. The second conductive layer 26 comprises a plurality of second conductive traces 260 for transmitting grounding signal, high speed signal or low speed signal. The second conductive traces 260 are disposed at a rear side of the first conductive traces 240. Each of the second conductive traces 260 comprises a second mating portion 261 for mating with the mating connector. The first mating portions 241 are disposed at a front of the second mating portions 261.

Figure 7:
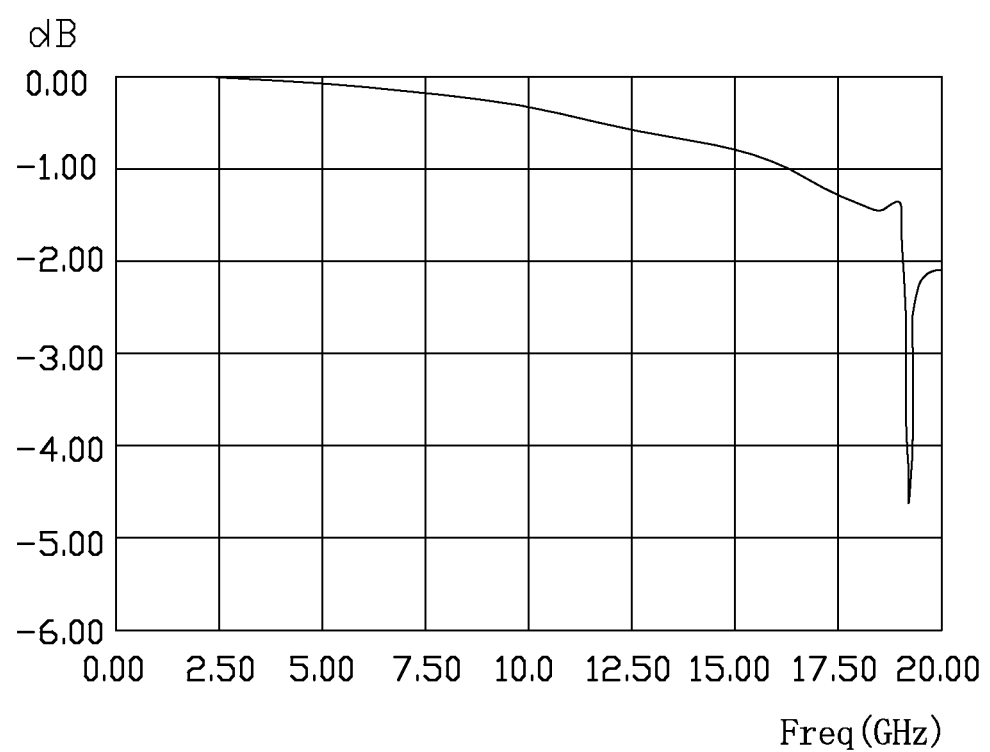
FIG. 7 is a simulation result graph showing attenuation versus frequency characteristic of the plug connector as shown in FIG. 1.

Referring to FIG. 7, a simulation result graph shows attenuation versus frequency characteristics of the plug connector 100. The attenuation has a smooth change when the frequency is less than 19 GHz. The signal transmission is resonated at 19 GHz, resulting in the attenuation rapidly changed. Therefore, the plug connector 100 has improved performance when the speed of each of the channel is less than 25 Gbps.

It is to be understood, however, that even though numerous characteristics and advanarmes of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical cable connector for mating with a receptacle connector, comprising:
    a printed circuit board defining an exterior conductive layer and an interior grounding layer spaced from each other via an insulative layer in a vertical direction,
    the exterior conductive layer including a pair of differential signal traces sandwiched between a pair of grounding traces in a transverse direction perpendicular to said vertical direction;
    each of said differential signal traces including a front mating portion for mating with a corresponding signal contact of the receptacle connector, a rear connecting portion to electrically and mechanically connect to a corresponding differential signal wire, and a body portion between the front mating portion and the rear connecting portion in a front-to-back direction perpendicular to both said vertical direction and said transverse direction; and
    each of said grounding traces including a front mating section located beside the front mating portion in the transverse direction and extending forwardly beyond the front mating portion in the front-to-back direction, and a body section behind the front mating section to mechanically and electrically connect to either a drain wire or a braiding of a cable including said differential signal wires; wherein
    along the vertical direction, a pair of front vias mechanically and electrically connect respectively the front mating sections with the grounding layer and a pair of rear vias mechanically and electrically connect respectively the body sections with the grounding layer.

2. The electrical cable connector as claimed in claim 1, wherein said pair of front vias are located in front of the front mating portions in the front-to-back direction.

* * * * *